United States Patent [19]

Bayer et al.

[11] Patent Number: 6,160,077
[45] Date of Patent: Dec. 12, 2000

[54] HALOGEN-FREE EPOXY RESIN

[75] Inventors: Heiner Bayer, Olching; Walter Fischer, Rosenheim; Wilhelm Hekele, Eggstaett; Ernst Wipfelder, Munich, all of Germany

[73] Assignee: Siemens Aktiengesellschaft, Munich, Germany

[21] Appl. No.: 09/197,290

[22] Filed: Nov. 20, 1998

[30] Foreign Application Priority Data

Nov. 21, 1997 [DE] Germany .............................. 197 51 738

[51] Int. Cl.[7] .............................. C08G 59/68; C08G 65/10
[52] U.S. Cl. ............................ 528/93; 549/546; 549/547; 549/554; 523/451; 523/461
[58] Field of Search ..................... 523/451, 461; 549/540, 547, 554; 528/93

[56] References Cited

U.S. PATENT DOCUMENTS

| | | | |
|---|---|---|---|
| 3,725,341 | 4/1973 | Roger et al. | 549/547 |
| 4,168,331 | 9/1979 | Davis | 427/58 |
| 5,158,990 | 10/1992 | Bayer et al. | 522/83 |

*Primary Examiner*—Robert Dawson
*Assistant Examiner*—D. Aylward
*Attorney, Agent, or Firm*—Schiff Hardin & Waite

[57] ABSTRACT

Halogen-free epoxy resins that arise from the addition of an epoxy component to a phenol component with base catalysis are disclosed, whereby the molar mass can be adjusted by means of the molar ratios of the initial materials. The resulting resins can be used in the field of electronics, both as molding compounds and as circuit board materials and adhesives.

19 Claims, No Drawings

HALOGEN-FREE EPOXY RESIN

FIELD OF THE INVENTION

The invention relates to a halogen-free epoxy resin with hydroxyl groups.

BACKGROUND OF THE INVENTION

The majority of technically available epoxy resins are obtained by the conversion of polyphenols with epichlorohydrin (ECH). The glycidyl compounds that thereby arise comprise, according to the conditions of the process, some tenths of a percent of chemically bound chlorine. Chlorine-free epoxy resins are preferable for various reasons, including ecological ones, and appear to be manufacturable via ECH synthesis, if at all, only with a large capital outlay and thus at a high cost.

However, halogen-free epoxy resins are of interest in particular for electronics applications, where the aim is to realize freedom from corrosion under temperature, climate and tensile stress.

In addition, resin components are desirable whose molar mass can be adjusted easily, preferably in the direction of higher-molecular products, by means of corresponding process parameters, in order in this way advantageously to construct flow and shrinkage behavior of formulations constructed therefrom.

Epoxy resins of this sort are required in particular for cationic hardening. In addition, given other hardening mechanisms they can also replace chlorine-containing polyepoxies, which are currently an essential component of molding compounds and circuit board materials.

Manufacturing methods are known that are based at least on halogen-free initial components. For example, ring-epoxied cycloaliphatic epoxy resins with polyphenols are converted to high-viscosity to solid epoxy resins. However, a considerable portion of halogen is introduced by the catalysts used, such as for example ammonium halide and phosphonium halide, since these catalysts can no longer be removed completely after the reaction has taken place. These catalyst residues are in addition responsible for the limited storage stability of epoxy resins synthesized in this way.

Another way, using epoxization of allyl-functional aromates by means of peracetic acid, failed due to the safety risk posed by this manufacturing process.

SUMMARY OF THE INVENTION

The object of the present invention is thus to produce epoxy resin from halogen-free initial components with halogen-free catalysts that have a low viscosity and whose molar mass, in particular with respect to higher-molecular resin, can be modified easily by adjusting the process parameters and by the selection of the initial compounds.

This object is solved according to the invention in that a halogen-free epoxy component is converted in a base-catalyzed halogen-free fashion with a phenol component, whereby the molar mass of the resulting resin can be controlled easily by the molar ratios of the components and the number of the functional groups of the two components that are reactive in the addition reaction.

The subject matter of the invention is a halogen-free epoxy resin that can be manufactured by means of the base-catalyzed conversion of an epoxy compound with a phenol component.

As a basic catalyst, an onium hydroxide is preferably used.

As epoxy components, ring-epoxied cycloaliphatic epoxies are preferably used.

As an epoxy resin, the 2:1 addition product is preferably contained that is manufactured from the reaction of a phenolic group equivalent with two epoxy group equivalents.

As epoxy components, ring-epoxied cycloaliphatic epoxy resins are preferably used. However, linear aliphatic epoxies are also suitable.

Thus, for example it is possible to use, as epoxy components, bis(3,4-epoxycyclohexylmethyl)adipate or 3,4-epoxycyclohexyl methyl-(3,4-epoxy)cyclohexanecarboxylate, or derivatives thereof that can be obtained by variation of The length of the centrally located alkyl chain (instead of 4 methyl units, 5 to 15 methyl units), or replacement of a hydrogen atom by an alkyl residue with 1 to 10 carbon atoms.

In particular, the two epoxy components CY 177 and CY 179 (available from the company CIBA Spezialitatenchemie GmbH) are used.

As phenol components, bisphenols, such as bisphenol A or 2,7-naphthalindiol, are preferably used. For the modification of the molar masses, substituted monophenols, such as for example p-nonylphenol, are suitable. The structure of 2,7-Napthalindiol is as follows:

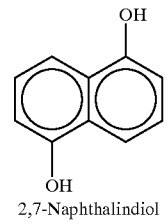
2,7-Naphthalindiol

Phenolic components with substituents carrying aliphatically bound hydroxyl groups are an important feature of the invention, such as e.g.:

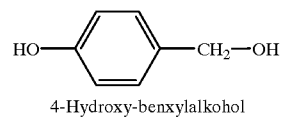
4-Hydroxy-benxylalkohol

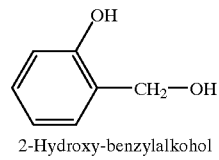
2-Hydroxy-benzylalkohol

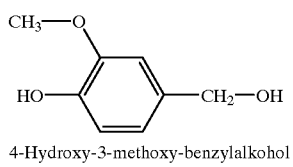
4-Hydroxy-3-methoxy-benzylalkohol

-continued

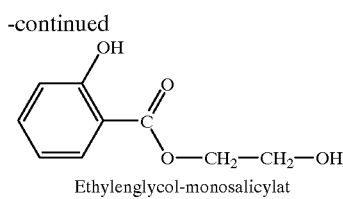

Ethylenglycol-monosalicylat

A further example of a polyphenol is:

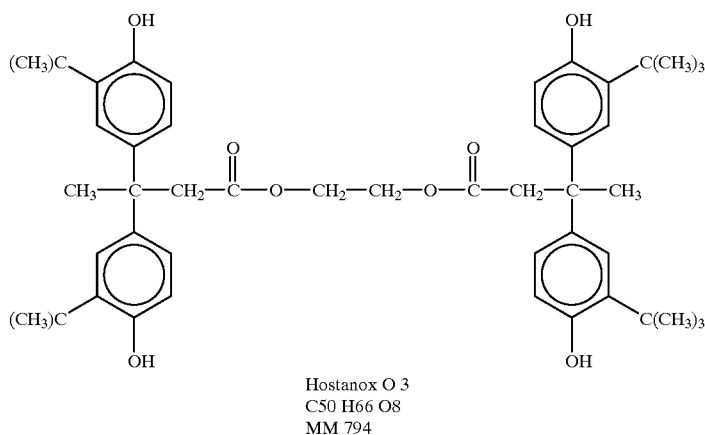

Hostanox O 3
C50 H66 O8
MM 794

In the phenol components stated as examples, it is also possible respectively to use simple derivates and homologues of the stated examples, as can be manufactured by lengthening the alkyl chains, replacing a proton by an alkyl residue, etc. In addition, arbitrary other phenol components can also be used according to the invention. An example is the already-cited tetraphenol (sold under the trademark "Hostanox O 3").

As a catalyst, all halogen-free bases can be used. The catalyst is preferably thermolabile, so that after the reaction terminates it preferably decomposes into volatile products, but at least into harmless ones. The catalyst is preferably soluble in water and/or alcohol. An onium hydroxide is preferably used as a catalyst. An example is tetramethylammonium hydroxide.

In the case of the bifunctional epoxy and bisphenol, the components are used in molar ratios between 2:1 (i.e. 2 epoxy component equivalents with one phenol component equivalent) up to 20:1, preferably 3:1 to 10:1. Given phenols with other functionalities, this ratio can change. However, work always takes place with an excess of epoxy, so that the phenolic hydroxyl groups are completely consumed after the reaction has terminated.

The manufacturing varies according to the initial materials used. In principle, both reaction partners are present in the solution with or without additional solvent, before the catalyst is added with heating, likewise with or without solvent. The reaction terminates after a few hours to a few days. The catalyst is preferably volatile, or, like a solvent that may be used, can be removed from the product using standard methods. If the catalyst can be tolerated as an impurity in the product, it can of course be left.

The end of the conversion can be recognized in that the viscosity or mixing practically no longer increases.

Other objects and advantages of the invention will become apparent upon reading the following detailed description and appended claims, and upon reference to the accompanying drawings.

DETAILED DESCRIPTION OF THE PRESENTLY PREFERRED EMBODIMENTS

Selected examples of inventive resins are contained in the following table.

The viscosity of the resins was determined on a plate/cone viscosimeter.

| Epoxy component | Mass portions | (Poly-)phenol | Mass portions | Shear viscosity (mPas)/° C. |
|---|---|---|---|---|
| CY179 | 100 | Bisphenol A | 10 | 25000/25 |
|  | 100 |  | 15 | 130000/25 |
|  | 100 |  | 16 | 218000/25, 21000/40 |
|  | 100 |  | 17 | 95000/40 |
|  | 100 |  | 20 | 2240/80 |
|  | 100 |  | 30 | 80000/80 |
| CY177 | 100 |  | 20 | 4200/80 |
| CY177 | 300 | Bisphenol A/ Nonylphenol | 45/15 | 450000/25 |
| CY179 | 100 | Bisphenol A | 54 | no constant viscosity achieved |
| CY179/ CY177 | 135/165 | Bisphenol A | 33 | 25000/25 |
| CY179 | 100 | 2,7-naphthalindiol/ Bisphenol A | 23/12 | 60000/150 |
| CY179/ CY177 | 170/130 | Hostanox O3 | 50 | 46000/25 |
| CY179 | 100 | Ethylene glycol monosalicylate | 26 | 29000/25 |
| CY179 | 100 | 2-hydroxy-benzyl alcohol | 18 | 24000/60 |

CY179: 3,4-epoxycyclohexylmethyl-(3,4-epoxy)cyclohexane carboxylate
CY177: Bis(3,4-epoxycyclohexylmethyl)adipate For example, a 2:1 conversion of bis(3,4-epoxycyclohexylmethyl)adipate with bisphenol A, with catalysis by tetraethylammonium hydroxide, can be reproduced by the following equation:

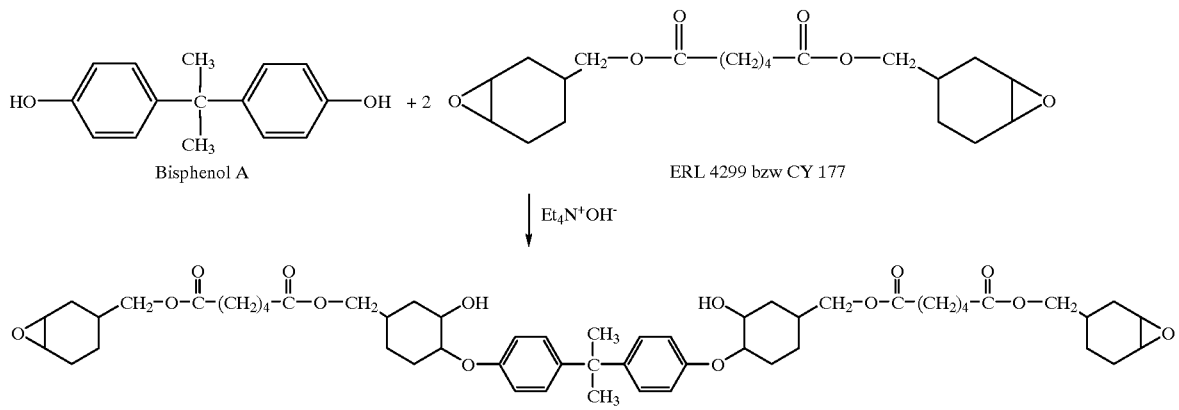

As an example, the manufacture of a different inventive product takes place as follows:

Manufacturing method (sample synthesis OH 120)

In a 500 ml round flask, 60 g bisphenol A (Merck, synthesis quality) is dissolved in 300 g diepoxy (Araldite CY 179, CIBA) at 90° C. under agitation. With a dosing syringe, 1 g Et$_4$NOH solution (Et=ethyl, Aldrich, 20% in water) is added. After homogenization, 1 hour agitation at 100° C., the flask with the reaction product is held at 100° C. for 20 hours. For the removal of the accelerator, the reaction mixture is agitated in an oil pump vacuum at 0.6 mbar and an oil bath temperature of 130° C., until only slight bubble formation is still observed.

Viscosity measurement at 80° C. with a rotation viscosimeter (cone/plate): at a shear speed of 625 s$^{-1}$, $\eta$=2100 mPas is obtained.

Epoxy value determination with a titrating solution of 2.5 g tetraethyl ammonium bromide in 10 ml pure acetic acid. Approx. 150 mg substance is dissolved in 20 ml acetone and mixed with 10 ml of the titrating solution. Indicator crystal violet in 0.1% pure acetic acid. The titration takes place with 0.1 N perchloric acid until change of color from violet to green. There results an epoxy value of 0.43±5 mol EP/100 g.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A halogen-free epoxy resin manufactured by conversion of an epoxy component, the epoxy component comprising a compound selected from the group consisting of bis(3,4-epoxycyclohexylmethyl)adipate, derivatives of bis (3,4-epoxycyclohexylmethyl)adipate, 3,4-epoxycyclohexylmethyl-(3,4-epoxy) cyclohexanecarboxylate, and derivatives of 3,4-epoxycyclohexylmethyl-(3,4-epoxy) cyclohexanecarboxylate with a phenol component in the presence of a catalyst comprising a tetraalkylammonium hydroxide, the catalyst being halogen free.

2. The epoxy resin of claim 1 wherein the epoxy component comprises a diepoxy and the phenol component comprises a bisphenol, the conversion being carried out with a molar ratio of diepoxy to bisphenol ranging from about 2:1 to about 20:1.

3. The epoxy resin of claim 1 wherein the phenol component comprises aliphatically bound hydroxyl groups.

4. The epoxy resin of claim 1 wherein the catalyst comprises tetramethylammonium hydroxide.

5. The epoxy resin of claim 1 wherein the epoxy component comprises a derivative of bis(3,4-epoxycyclohexylmethyl)adipate obtained by varying of the length of the centrally located alkyl chain.

6. The epoxy resin of claim 1 wherein the epoxy component comprises a derivative of bis(3,4-epoxycyclohexylmethyl)adipate obtained replacing a hydrogen atom by an alkyl residue having 1 to 10 carbon atoms.

7. The epoxy resin of claim 1 wherein the epoxy component comprises a derivative of 3,4-epoxycyclohexylmethyl-(3,4-epoxy) cyclohexanecarboxylate obtained by varying of the length of the centrally located alkyl chain.

8. The epoxy resin of claim 1 wherein the epoxy component comprises a derivative of 3,4-epoxycyclohexylmethyl-(3,4-epoxy) cyclohexanecarboxylate obtained replacing a hydrogen atom by an alkyl residue having 1 to 10 carbon atoms.

9. The epoxy resin of claim 1 wherein said resin is a cast resin.

10. The epoxy resin of claim 1 wherein said resin is a cationically hardenable epoxy resin.

11. The epoxy resin of claim 1 wherein said resin is a light-induced cationically hardenable epoxy resin.

12. A method of covering of electronic components with an epoxy resin comprising the step of covering an electric component with the resin of claim 1.

13. The epoxy resin of claim 1 wherein said resin is a molding compound.

14. The epoxy resin of claim 1 wherein said resin is a circuit board material.

15. The epoxy resin of claim 1 wherein said resin is an adhesive.

16. A halogen-free epoxy resin manufactured by conversion of an epoxy component with a phenol component in the presence of a catalyst comprising an onium hydroxide, the catalyst being halogen free, the epoxy component comprising a diepoxy and the phenol component comprising a bisphenol, the conversion being carried out with a molar ratio of diepoxy to bisphenol ranging from about 3:1 to about 10:1.

17. The epoxy resin of claim 16 wherein the phenol component comprises aliphatically bound hydroxyl groups.

18. The epoxy resin of claim 16 wherein the catalyst comprises tetramethylammonium hydroxide.

19. A halogen-free epoxy resin manufactured by conversion of an epoxy component with a phenol component in the presence of a catalyst comprising an onium hydroxide, the epoxy component comprising at least one compound selected from the group consisting of bis (3,4-epoxycyclohexylmethyl)adipate, derivatives of bis(3,4-epoxycyclohexylmethyl)adipate, 3,4-epoxycyclohexylmethyl-(3,4-epoxy)cyclohexanecarboxylate, and derivatives of 3,4-epoxycyclohexylmethyl-(3,4-epoxy)cyclohexanecarboxylate, the phenol component comprising a bisphenol with aliphatically bound hydroxyl groups, the conversion being carried out with a molar ratio of diepoxy to bisphenol ranging from about 3:1 to about 10:1, and the catalyst comprising tetramethylammonium hydroxide, the catalyst being epoxy free.

* * * * *